(12) United States Patent
Cheng

(10) Patent No.: US 6,910,809 B2
(45) Date of Patent: Jun. 28, 2005

(54) ELECTRICAL SUB-ASSEMBLY DESIGN FOR PARALLEL OPTICS MODULES

(75) Inventor: Hengju Cheng, Mountain View, CA (US)

(73) Assignee: Stratos International, Inc., Chicago, IL (US)

( * ) Notice: Subject to any disclaimer, the term of this patent is extended or adjusted under 35 U.S.C. 154(b) by 73 days.

(21) Appl. No.: 10/295,631

(22) Filed: Nov. 15, 2002

(65) Prior Publication Data

US 2003/0113073 A1 Jun. 19, 2003

Related U.S. Application Data

(60) Provisional application No. 60/334,679, filed on Nov. 15, 2001.

(51) Int. Cl.[7] .................................. G02B 6/36
(52) U.S. Cl. .......................... 385/89; 385/59
(58) Field of Search .................. 385/59, 88–94

(56) References Cited

U.S. PATENT DOCUMENTS 5,445,608 A * 8/1995 Chen et al. ................ 604/20
5,655,290 A * 8/1997 Moresco et al. ........... 29/830
6,676,302 B2 * 1/2004 Cheng et al. ............... 385/88
2003/0044157 A1 * 3/2003 Wickman et al. ......... 385/140

OTHER PUBLICATIONS

U.S. patent application Ser. No. 60/334,679, filed Nov. 15, 2001.

* cited by examiner

Primary Examiner—Chau N. Nguyen
(74) Attorney, Agent, or Firm—Karl D. Kovach

(57) ABSTRACT

A device includes a printed circuit board, a first photoactive array, a second photoactive array, a first driver chip, a second driver chip, a first connector, and a second connector. The printed circuit board includes a mounting surface section, a first flex circuit, a second flex circuit, a first rigid section, and a second rigid section. The first and second flex circuits are oriented substantially ninety degrees to the mounting surface section. The first rigid section is oriented substantially ninety degrees to the first flex circuit, and the second rigid section is oriented substantially ninety degrees to the second flex circuit. The first rigid section and the second rigid section lie substantially in the same plane. The first and second photoactive arrays, and the first and second driver chips are mounted on the mounting surface section.

16 Claims, 2 Drawing Sheets

ELECTRICAL SUB-ASSEMBLY DESIGN FOR PARALLEL OPTICS MODULES

This non-provisional application claims the priority of the earlier filed U.S. Provisional Patent Application Ser. No. 60/334,679, filed Nov. 15, 2001. U.S. Provisional Patent Application Ser. No. 60/334,679 is hereby incorporated herein by reference.

BACKGROUND OF THE INVENTION

1. Field of the Invention

The present invention pertains to the field of optoelectronics. The invention more particularly concerns an optoelectronic device which incorporates parallel optics and a three dimensional circuit board.

2. Discussion of the Background

Optoelectronic devices such as transceivers, transmitters, and receivers are known in the art. Furthermore, optoelectronic devices are known to incorporate parallel optics. Parallel optics are integrated into optoelectronic devices so as to increase the data density for a given unit of area or footprint and space. As an example, an eight channel optoelectronic device has eight photoactive devices. All eight of the photoactive devices can be transmitting devices such as a vertical cavity surface emitting laser (VCSEL) or a light emitting diode (LED) or some other light emitting device, or all eight of the photoactive devices can be receiving devices such as a photodetector or a PIN diode, or the eight photoactive devices can be a combination of light emitting devices and photodetectors.

Parallel optics optoelectronic devices contain electronics for modulating the photoactive elements. Typically the electronics are placed within or on the chassis of the optoelectronic device. However, as the modulation frequency is increased it is desirable to place the modulation electronics as close as possible to the photoactive devices. Given traditional board layout, a limit is reached as to how small the optoelectronic device can become due to the placement of the large number of electronics required while maintaining adequate heat dissipation.

Thus, there is a need for a device which is more compact (higher data density), more reliable, less costly, and easier to assemble than prior art devices.

SUMMARY OF THE INVENTION

Therefore, it is an object of the invention to provide an optoelectronic device which contains a higher density of photoactive devices per unit area as compared to known devices.

It is another object of the invention to provide an optoelectronic device which is easier to assemble than known devices.

In one form of the invention, the optoelectronic device includes a printed circuit board, a first photoactive array, a second photoactive array, a first driver chip, a second driver chip, a first connector, and a second connector. The printed circuit board includes a mounting surface section, a first flex circuit, a second flex circuit, a first rigid section, and a second rigid section. The first flex circuit is oriented substantially ninety degrees to the mounting surface section, and the second flex circuit is oriented substantially ninety degrees to the mounting surface section. The first rigid section is oriented substantially ninety degrees to the first flex circuit, and the second rigid section is oriented substantially ninety degrees to the second flex circuit. The first rigid section and the second rigid section lie substantially in the same plane. The first photoactive array, the second photoactive array, the first driver chip, and the second driver chip are mounted on the mounting surface section. The first connector is attached to the first rigid section, and the second connector is attached to the second rigid section.

In yet another form of the invention, the optoelectronic device includes a rigid flex PCB which is folded in three dimensions for supporting a three dimensional configuration of photoactive devices, signal lines and electrical connectors. The rigid flex PCB includes a rigid front-facing mounting surface, a pair of adjoining side-facing flex sections, and a pair of adjoining downward-facing rigid bottoms. The rigid front-facing mounting surface has one or more front-facing semiconductor IC chips mounted thereon containing photoactive devices. The pair of adjoining side-facing flex sections are oriented at right angles to the front face, and the pair of side-facing flex sections have a plurality of signal lines. The pair of adjoining downward-facing rigid bottom boards are oriented at right angles to the flex sections and to the front mounting surface. The pair of down-ward-facing rigid bottom boards each have a respective down-ward-facing electrical connector which is coupled to the IC chips via the signal lines in the flex sections.

In still yet another form of the invention, the optoelectronic device includes a planar rigid flex PCB, a plurality of first semiconductor IC chips, a plurality of second semiconductor chips, and a plurality of signal lines. The first plurality of semiconductor IC chips includes linear arrays of photoactive components. Each semiconductor IC chip of the first plurality of semiconductor IC chips being mounted along side and parallel with one another so that the arrays are aligned in parallel with one another. The second plurality of semiconductor IC chips adapted for driving the photoactive components. Each semiconductor IC chip of the second plurality of semiconductor IC chips mounted alongside and parallel with the first plurality of semiconductor IC chips and electrically coupled to the first plurality of semiconductor IC chips. The plurality of signal lines extending through the rigid flex PCB for conducting signals to and from the first and second semiconductor IC chips.

In still another form of the invention, the capacitive device includes a planar layer of rigid flex PCB, a first planar metal layer, and a second planar metal layer. The planar layer of rigid flex PCB substrate material is integral with a part of a PCB rigid flex board. The first planar metal layer runs along one side of the PCB substrate material on the PCB board. The second planar metal layer runs along the other side of the PCB substrate material on the PCB board opposite the first metal layer.

Thus, the present invention provides an optoelectronic device which is easy to assemble, has a reduced part count, and has a high density of photoactive devices.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PRESENTLY PREDERRED EMBODIMENTS

Figure 1:
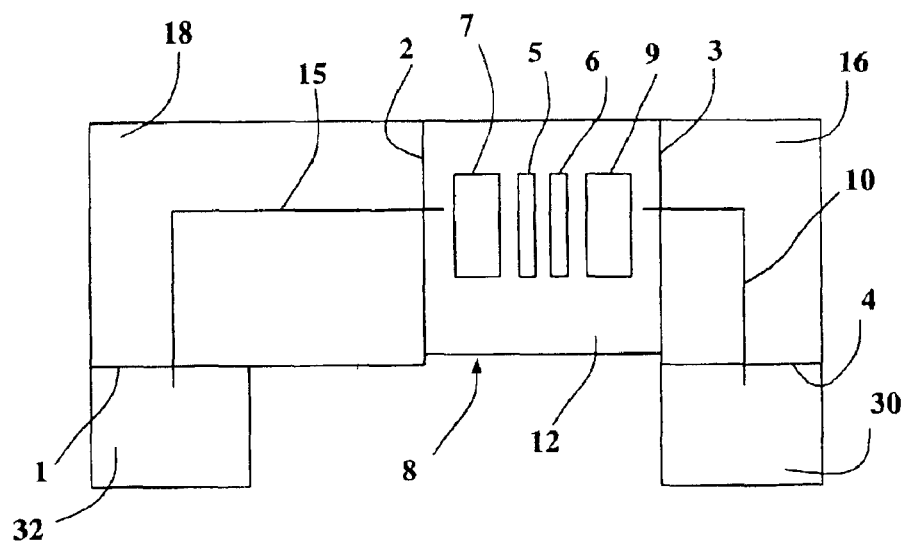
FIG. 1 is a plan view of an unfolded printed circuit board of the invention.
Figure 2:
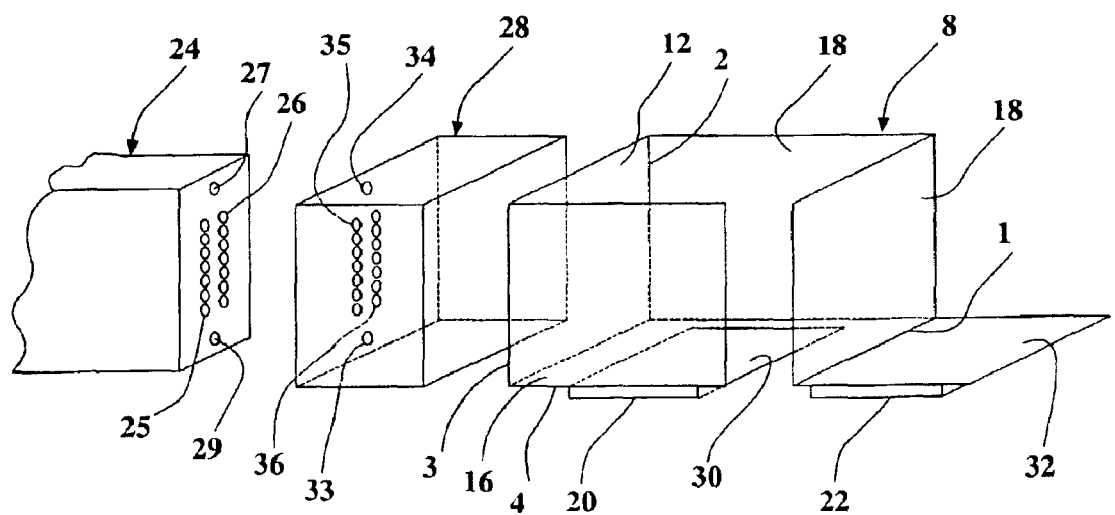
FIG. 2 is an exploded perspective view of the folded printed circuit board of FIG. 1 associated with a lens element, and a ferrule.

Referring now to the drawings, wherein like reference numerals designate identical or corresponding parts throughout the several views, and more particularly to FIGS. 1 and 2 thereof, is a device incorporating elements of a first embodiment of the invention.

FIG. 1 is a plan view or two-dimensional view of a printed circuit board or PCB 8 in an unfolded state. The printed circuit board 8 is made of a rigid-flex material. The rigid-flex material is substantially rigid in some sections and is flexible in other sections or locations along seams 1, 2, 3, and 4. The seams 1, 2, 3, 4 separate the printed circuit board 8 into five segments 12, 16, 18, 30, and 32. Segment 12 is known as a mounting surface section. Segments 16, 18 are known as flex circuits. Segments 30, 32 are known as rigid sections.

A first array 5 is mounted to the mounting surface section 12. A second array 6 is also mounted to the mounting surface section 12. Each array 5, 6 can contain any number of photoactive devices. Typically, one array 5 or 6 will contain twelve photoactive devices, namely VCSELs, and the other array 5 or 6 will contain twelve photoactive devices, namely PIN diodes. However, both arrays 5, 6 can contain all transmitting devices, or all receiving devices, or a combination of both transmitting devices and receiving devices. The arrays 5, 6 can be made of IC chips and the array of photoactive devices are typically positioned in a linear arrangement. As shown in FIG. 1, the first array 5 is positioned substantially parallel to the second array 6. In this embodiment, the device provides for twenty-four channels.

A first driver chip 7 such as an IC chip is mounted on the mounting surface section 12. The first driver chip 7 contains driver circuitry for controlling the operation of the first array 5. Likewise, a second driver chip 9 such as an IC chip is mounted on the mounting surface section 12. The second driver chip 9 contains driver circuitry for controlling the operation of the second array 6. The first driver chip 7 is electrically connected to the first array 5, for example, by way of wire bonding or wire bonds (not shown). The second driver chip 9 is electrically connected to the second array 6, for example, by way of wire bonding or wire bond (not shown).

A first signal line or trace 15 is shown traversing flex circuit 18 and portions of mounting surface section 12 and rigid section 32. The first signal line 15 can represent a plurality of signal lines traversing such segment 12, 18, 32, however, for reason of clarity, only one signal line is shown. The first signal line 15 is electrically connected or associated with the first driver chip 7. The first signal line 15 is also electrically connected or associated with a first connector 22 (see FIG. 2). The first connector 22 is mounted on the rigid section 32. The first connector 22 can be, for example, a meg array. The first and second connectors 20, 22 are configured so as to electrically connect to circuits of another device or another printed circuit board such as a motherboard. The first and second connectors 20, 22 have connection pins for attaching to the motherboard.

A second signal line or trace 10 is shown traversing flex circuit 16 and portions of mounting surface section 12 and rigid section 30. The second signal line 10 can represent a plurality of signal lines traversing such segment 12, 16, 30, however, for reason of clarity, only one signal line is shown. The second signal line 10 is electrically connected or associated with the second driver chip 9. The second signal line 10 is also electrically connected or associated with a second connector 20 (see FIG. 2). The second connector 20 is mounted on the rigid section 30. The second connector 20 can be, for example, a meg array.

Additionally, a heat sink device (not shown) such as a metallic body with or without cooling fins can be mounted to a side of the mounting surface section 12 opposite the IC chips 5, 6, 7, 9. The heat sink device draws heat away from the first and second driver chips 7, 9 and through the thickness of the mounting surface section 12.

FIG. 2 is an exploded perspective view of the folded printed circuit board 8 of FIG. 1 associated with a lens element 28, and a ferrule 24. The printed circuit board 8 is manipulated or folded along seams 1, 2, 3, 4, and a portion of the flex circuit 18 is bent, rolled, or flexed so as to achieve the three-dimensional shape as shown in the FIG. 2 which provides the foundation for a 2×12 parallel optics module having twenty-four channels. The printed circuit board 8 is folded so that the arrays 5, 6 of the mounting surface section 12 face the lens element 28. The flex circuits 16, 18 are positioned substantially ninety degrees to the mounting surface section 12. The rigid section 30 is positioned substantially ninety degrees to the flex circuit 16, and the rigid section 32 is positioned substantially ninety degrees to the flex circuit 18. A portion of the flex circuit 18 is bent substantially ninety degrees relative to itself. Rigid section 30 is positioned in substantially the same plane as rigid section 32.

The lens element 28 contains a first row of lenses 36 and a second row of lenses 35. The first row of lenses 36 are optically associated with the photoactive devices of the first array 5, and the second row of lenses 35 are optically associated with the photoactive devices of the second array 6. Each row of lenses 35, 36 show only seven lenses per row. Furthermore, the lenses are shown facing the ferrule 24 and the lenses are shown in solid line instead of being shown in hidden line due to reasons of clarity. In practice, one lens is associated with one photoactive device. Thus, in this embodiment, each row of lenses 35, 36 has twelve lenses, but only seven are shown for reasons of clarity. The lens element 28 also has a first aperture 33 for receiving a first alignment pin, and a second aperture 34 for receiving a second alignment pin. As with the lens, the first and second alignment apertures 33, 34 face the ferrule 24, however, the first and second alignment apertures 33, 34 are shown in solid line instead of hidden line due to reasons of clarity.

The ferrule 24 includes a first aperture 29 for receiving a first alignment pin, and a second aperture 27 for receiving a second alignment pin. The ferrule 24 also includes a first row of polished optical fiber ends 26, and a second row of polished optical fiber ends 25. In this embodiment, each row of polished optical fiber ends 25, 26 contain twelve optical fiber ends, but due to reasons of clarity only seven of the ends are shown per row. One optical fiber end is optically associated with one lens. Therefore, the first row of polished optical fiber ends 26 is optically associated with the photoactive devices of the first array 5, and the second row of polished optical fiber ends 25 is optically associated with the photoactive devices of the second array 6.

The first and second apertures 27, 29 of the ferrule 24 are associated with the first and second apertures 33, 34 of the lens element 28 by way of first and second alignment pins (not shown) so as to align the ferrule 24 with the lens element 28. As shown in FIG. 2, the ferrule 24 has substantially the same dimensions as a standard MT-style ferrule; however, any ferrule standard can be used. The first aperture 29 of the ferrule is substantially co-axial with the first aperture 33 of the lens element 28, and the second aperture 27 of the ferrule 24 is substantially co-axial with the second aperture 34 of the lens element 28.

Figure 3:
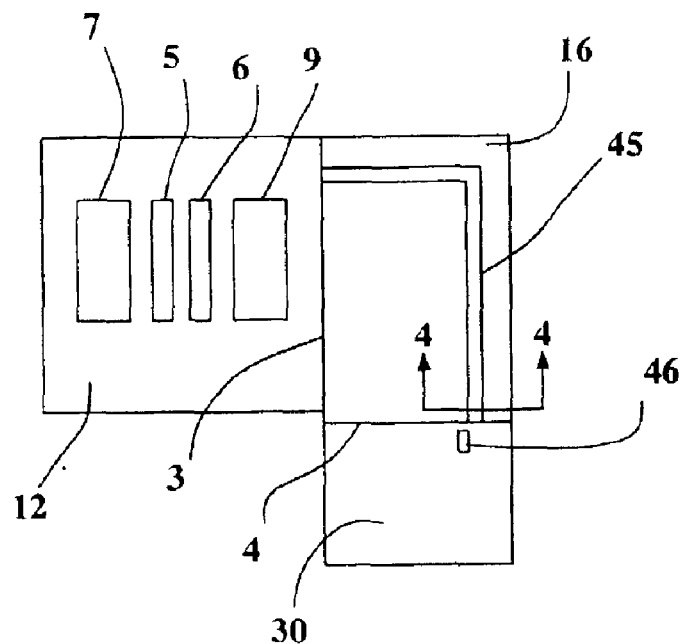
FIG. 3 is a plan view of a portion of a printed circuit board containing a distributed capacitor of the invention.
Figure 4:
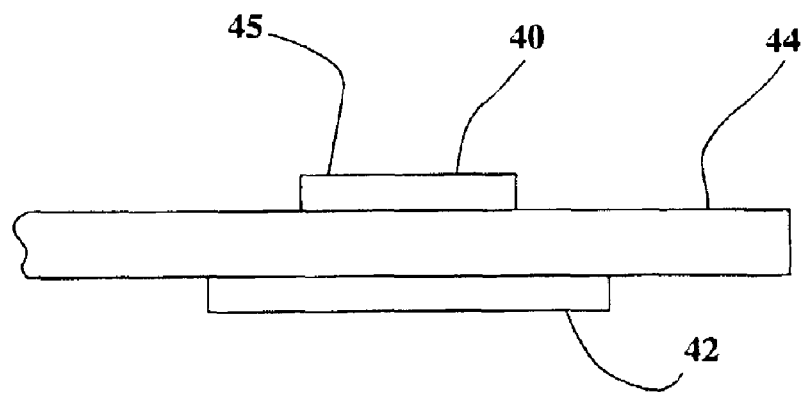
FIG. 4 is a section view of the distributed capacitor along section line 4—4 of FIG. 3.

FIGS. 3 and 4 present a second device 45 which preferably is used in conjunction with the device described above. FIG. 3 is a plan view of a portion of a flex circuit 16 of a printed circuit board, as previously discussed, containing a distributed capacitor 45. The distributed capacitor 45 includes a first metal layer 40 and a second metal layer 42 separated by the substrate 44 material of the flex circuit 16. The distributed capacitor 45 is important since traditional electronic circuitry designs require that a by-pass capacitor be positioned in close proximity to the driver chips 7, 9 so as to be effective at higher frequencies. However, the mounting surface section 12 is highly populated with driver chips 7, 9 and arrays of photoactive devices 5, 6, thus there is not much real estate left onto which a discrete capacitor can be mounted. Furthermore, the mounting of capacitors traditionally requires the application of solder which may contaminate the arrays 5, 6 or the mounting surface section 12. Therefore, the distributed capacitor 45 is positioned off of the mounting surface section 12, yet adjacent thereto and employs portions of the flex circuit 44 to form the distributed capacitor 45.

FIG. 4 is a cross-sectional view taken along section line 4—4 of FIG. 3 which clearly shows the substrate 44 separating the two metal layers 40, 42. Since the flex circuit 16 is thin and has substantial area, the present design of a distributed capacitor 45 having significant capacitance is possible. Such an arrangement is effective if a larger discrete by-pass capacitor 46 is mounted in parallel with the distributed capacitor 45 on the rigid section 30 so as to deal, at a distance, with the lower frequencies. Therefore, a discrete by-pass capacitor is not required on the mounting surface section 12. Such an arrangement simplifies the design of the optical sub-assembly and significantly enhances the manufacturability of the device.

Obviously, numerous modifications and variations of the present invention are possible in light of the above teachings. It is therefore to be understood that within the scope of the appended claims, the invention may be practiced otherwise than as specifically described herein.

What is claimed is:

1. An optoelectronic device comprising:
   a printed circuit board having a mounting surface section, a first flex circuit, a second flex circuit, a first rigid section, and a second rigid section, the first flex circuit oriented substantially ninety degrees to the mounting surface section, a portion of the second flex circuit oriented substantially ninety degrees to the mounting surface section, the first rigid section oriented substantially ninety degrees to the first flex circuit, and the second rigid section oriented substantially ninety degrees to the second flex circuit, and wherein the first rigid section and the second rigid section lie substantially in the same plane;
   a first photoactive array mounted to the mounting surface section of the printed circuit board;
   a second photoactive array mounted to the mounting surface section of the printed circuit board;
   a first driver chip mounted to the mounting surface section of the printed circuit board;
   a second driver chip mounted to the mounting surface section of the printed circuit board;
   a first connector attached to the first rigid section; and
   a second connector attached to the second rigid section.

2. An optoelectronic device according to claim 1, further comprising a lens element having multiple lenses, and wherein each lens of the lens element is associated with a respective photoactive device of the first and second photoactive arrays.

3. An optoelectronic device according to claim 2 wherein the lens element is sized so as to be mateable with an MT-style ferrule.

4. An optoelectronic device according to claim 3, further comprising a first metal layer attached to one side of at least one of the first flex circuit and the second flex circuit, and further comprising a second metal layer attached to an opposite side of the at least one of the first flex circuit and the second flex circuit so as to form a distributed capacitor.

5. An optoelectronic device according to claim 4 wherein the first photoactive array has photoactive devices that are VCSELs.

6. An optoelectronic device according to claim 4 wherein the first photoactive array has photoactive devices that are photodetectors.

7. An optoelectronic device according to claim 6 wherein the second photoactive array has photoactive devices that are photodetectors.

8. An optoelectronic device according to claim 5 wherein the second photoactive array has photoactive devices that are VCSELs.

9. An optoelectronic device according to claim 5 wherein the second photoactive array has photoactive devices that are photodetectors.

10. An optoelectronic device according to claim 5 wherein the first photoactive array includes twelve VCSELs.

11. An optoelectronic device according to claim 8 wherein the second photoactive array includes twelve VCSELs.

12. An optoelectronic device according to claim 1, further comprising a first metal layer attached to one side of at least one of the first flex circuit and the second flex circuit, and further comprising a second metal layer attached to an opposite side of the at least one of the first flex circuit and the second flex circuit so as to form a distributed capacitor.

13. An electrical subassembly for use in fiber optic communications, comprising:
   a rigid flex PCB which is folded in three dimensions for supporting a three dimensional configuration of photoactive devices, signal lines and electrical connectors, including:
      a rigid front-facing mounting surface having one or more front-facing semiconductor IC chips mounted thereon containing photoactive devices,
      a pair of adjoining side-facing flex sections at right angles to said front-facing mounting surface having a plurality of signal lines running through them, and
      a pair of adjoining downward-facing rigid bottom boards adjoining said side-facing flex sections at right angles to said side-facing flex sections and front-facing mounting surface having a downward-facing electrical connector mounted on each board which is coupled to said IC chips via said signal lines in said side-facing flex sections.

14. An electrical subassembly according to claim 13 wherein said front-facing mounting surface also has one or more driver chips mounted thereon for providing drive signals to said photoactive devices.

15. An electrical subassembly according to claim 13 wherein said one or more semiconductor IC chips comprise:
   a pair of side-by-side mounted VCSEL chips, and
   a pair of driver IC chips mounted alongside said VCSEL chips.

16. An electrical subassembly according to claim 13 wherein said electrical connectors comprise meg arrays.

* * * * *